(12) United States Patent
di Leo et al.

(10) Patent No.: US 11,920,522 B2
(45) Date of Patent: Mar. 5, 2024

(54) METHOD AND APPARATUS FOR CONTROLLING FUEL FLOW INTO AN AIRCRAFT ENGINE

(71) Applicant: GE Avio S.r.l., Rivalta di Torino (IT)

(72) Inventors: Diego di Leo, Trani (IT); Lorenzo Cipolla, Turin (IT); Simone Recchia, Bari (IT); Cristian Lai, Bari (IT)

(73) Assignee: GE Avio S.r.l., Rivalta di Torino (IT)

( * ) Notice: Subject to any disclaimer, the term of this patent is extended or adjusted under 35 U.S.C. 154(b) by 0 days.

(21) Appl. No.: 17/882,268

(22) Filed: Aug. 5, 2022

(65) Prior Publication Data
US 2023/0279816 A1 Sep. 7, 2023

(30) Foreign Application Priority Data
Mar. 7, 2022 (IT) .......................... 102022000004256

(51) Int. Cl.
| | | |
|---|---|---|
| F02M 51/00 | (2006.01) | |
| F02C 7/232 | (2006.01) | |
| F02C 9/26 | (2006.01) | |
| F16K 37/00 | (2006.01) | |
| G01R 27/02 | (2006.01) | |
| B64D 37/00 | (2006.01) | |

(52) U.S. Cl.
CPC .............. *F02C 9/263* (2013.01); *F02C 7/232* (2013.01); *F16K 37/0041* (2013.01); *G01R 27/02* (2013.01); *B64D 37/00* (2013.01)

(58) Field of Classification Search
CPC .... F02C 9/26; F02C 9/263; F02C 7/23; F02C 7/232; F16K 37/00; F16K 37/0041; G01R 27/02; F02M 51/00; F02M 61/16; B60T 7/12

USPC .......... 701/102–104, 114; 123/478–481, 486
See application file for complete search history.

(56) References Cited

U.S. PATENT DOCUMENTS

| | | |
|---|---|---|
| 3,520,133 A | 7/1970 | Arne |
| 3,639,076 A | 2/1972 | Rowen |
| 6,810,674 B2 | 11/2004 | Clements |
| 7,108,493 B2 | 9/2006 | Clements |
| 7,237,535 B2 | 7/2007 | Eick |

(Continued)

FOREIGN PATENT DOCUMENTS

| | | |
|---|---|---|
| CN | 100507240 | 7/2009 |
| EP | 3670874 | 6/2020 |

*Primary Examiner* — John Kwon
*Assistant Examiner* — Johnny H Hoang
(74) *Attorney, Agent, or Firm* — Fitch, Even, Tabin & Flannery LLP

(57) ABSTRACT

Based upon a measured first resistance, a first delta curve is selected. Based upon a measured second resistance, a second delta curve is selected. A first fuel valve position (FVP) is received from a first position sensor, and the first FVP is applied to the first delta curve to obtain a first offset. A second FVP is received from a second position sensor, and the second FVP is applied to the second delta curve to obtain a second offset. The first offset is applied to the first measured FVP to obtain the first compensated FVP and the second offset is applied to the second measured FVP to obtain the second compensated FVP. The first compensated FVP and the second compensated FVP are correlated to obtain a final compensated FVP, which is applied to a desired fuel valve position to obtain a final fuel valve position.

20 Claims, 6 Drawing Sheets

(56) References Cited

U.S. PATENT DOCUMENTS

| | | | |
|---|---|---|---|
| 9,206,775 B2 * | 12/2015 | Ripley | F02M 37/0052 |
| 10,228,670 B2 | 3/2019 | Swope | |
| 11,768,138 B2 * | 9/2023 | Jamison | G01N 27/12 |
| | | | 166/264 |
| 2007/0044768 A1 | 3/2007 | Eick | |
| 2010/0170572 A1 * | 7/2010 | Sahoo | B01L 3/50273 |
| | | | 422/400 |
| 2013/0276522 A1 | 10/2013 | Chalaud | |
| 2018/0005743 A1 | 1/2018 | Plucinski | |
| 2018/0173174 A1 | 6/2018 | Swope | |
| 2019/0204799 A1 | 7/2019 | Swope | |
| 2021/0362838 A1 | 11/2021 | Forte | |

* cited by examiner

US 11,920,522 B2

METHOD AND APPARATUS FOR CONTROLLING FUEL FLOW INTO AN AIRCRAFT ENGINE

RELATED APPLICATIONS

This application claims priority from Italian Patent Application Number IT 102022000004256 filed Mar. 7, 2022, which is hereby incorporated herein by reference in its entirety.

TECHNICAL FIELD

These teachings relate generally to jet engines and more particularly to controlling the operation of fuel valves of jet engines.

BACKGROUND

In an aircraft, fuel flows from fuel tank and is delivered to the engine where it is ignited to power the engine. Fuel flow is calculated based on FMV (Fuel Metering Valve) position and is measured typically in small engines through a Linear Variable Differential Transducer (LVDT). This measurement is affected by a certain error, impacting fuel flow calculation accuracy, and the error is taken into account in engine operability.

BRIEF DESCRIPTION OF THE DRAWINGS

Various needs are at least partially met through provision of the method and apparatus for controlling fuel flow to an engine described in the following detailed description, particularly when studied in conjunction with the drawings. A full and enabling disclosure of the aspects of the present description, including the best mode thereof, directed to one of ordinary skill in the art, is set forth in the specification, which refers to the appended figures, in which.

Figure 1:
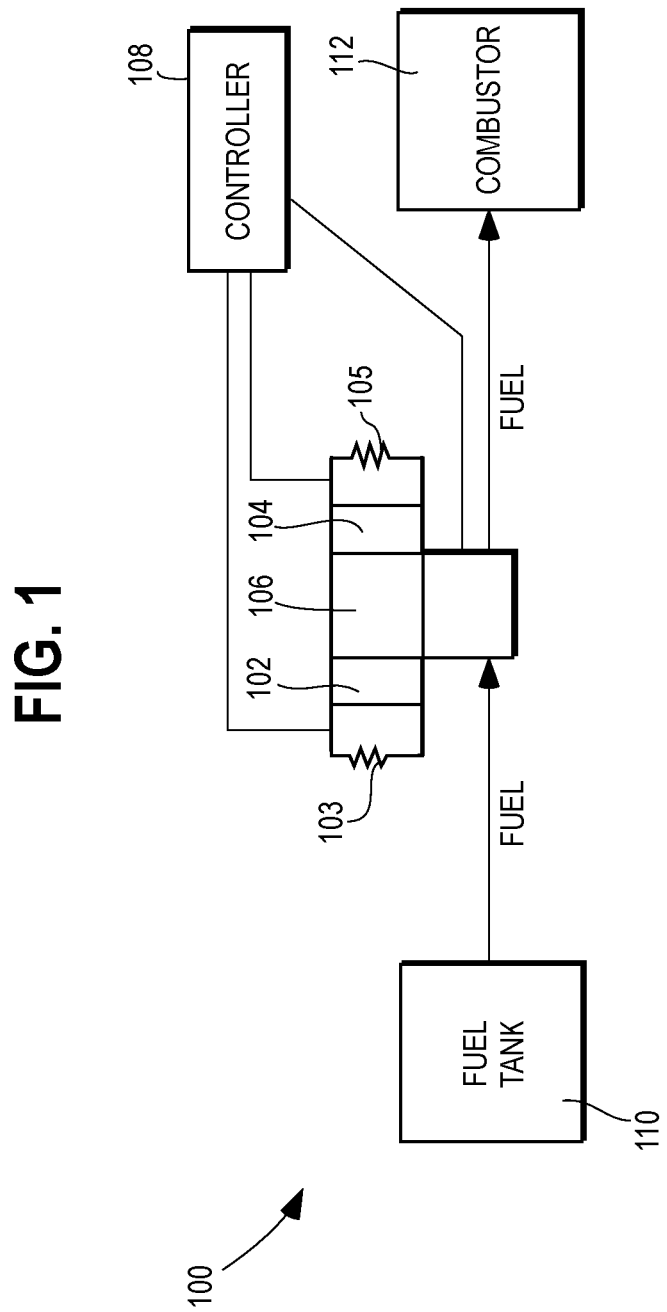
FIG. 1 comprises a diagram as configured in accordance with various embodiments of these teachings.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present teachings. Also, common but well-understood elements that are useful or necessary in a commercially feasible embodiment are often not depicted in order to facilitate a less obstructed view of these various embodiments of the present teachings. Certain actions and/or steps may be described or depicted in a particular order of occurrence while those skilled in the art will understand that such specificity with respect to sequence is not actually required.

DETAILED DESCRIPTION

The present approaches utilize various sensors to obtain FMV position measurements, but these measurements are compensated (e.g., through dedicated software logic), thus minimizing or otherwise reducing the discrepancy of calculated fuel flow on the two channels and derived performance/operability impacts.

Advantageously, the present approaches provide a low-cost solution to measuring valve opening (e.g., by using calibration resistors) and increased fuel flow calculation accuracy. The present decrease the amount of operability margins to be taken into account during a design phase. These approaches also manage different calibration resistors on, for example, two channels, with no impact on calculated fuel flow accuracy. Further, these approaches do not need higher precision LVDT sensors or dedicated fuel flowmeter (which would increase costs and weight). These approaches also do not require suppliers to deliver a fuel metering unit with the same LVDT error distribution on all channels (which would lead to a higher unit cost).

In many of these embodiments, a first resistance of a first resistor associated with a first position sensor is measured. Based upon the measured first resistance, a first delta curve is selected, the first delta curve describing differences between a nominal fuel flow and a measured fuel flow associated with the first position sensor.

A second resistance of a second resistor associated with a second position sensor is measured. Based upon the measured second resistance, a second delta curve is selected, the second delta curve describing differences between the nominal fuel flow and a measured fuel flow associated with the second position sensor.

A first fuel valve position (FVP) is received from the first position sensor, and the first FVP is applied to the first delta curve to obtain a first offset. A second FVP is received from the second position sensor, and the second FVP is applied to second delta curve to obtain a second offset. The first offset is added to the first FVP to obtain the first compensated FVP. The second offset is added to the second FVP to obtain the second compensated FVP. The first compensated FVP and the second compensated FVP are correlated to obtain a final compensated FVP. The final compensated FVP is used to control the operation of the fuel valve.

In aspects, the first delta curve and second delta curve are represented as a table.

In other aspects, the current fuel value position is displayed via an apparatus in a cockpit of an aircraft.

In examples, the fuel valve controls an amount of fuel provided to an engine of an aircraft.

In other examples, the first delta curve and the second delta curve are derived from curves obtained by an engine manufacturer.

In yet other examples, the first FVP and the second FVP indicate an amount of an opening of the fuel valve.

In some examples, the steps are performed in a continuous loop.

In other aspects, the first offset and the second offset are similar in values. In examples, the correlating averages the first offset and second offset.

In others of these embodiments, a system comprises a first position sensor; a second position sensor; a fuel valve; and a controller coupled to the first position sensor, the second position sensor, and the fuel valve. A first resistance of a first resistor associated with a first position sensor is measured and based upon the measured first resistance, a first delta curve is selected, the first delta curve describing differences between nominal fuel flow and a measured flow associated with the first position sensor.

A second resistance of a second resistor associated with a second position sensor is measured and based upon the measured second resistance, a second delta curve is selected, the second delta curve describing differences between the nominal fuel flow and a measured fuel flow associated with the second position sensor.

The controller is configured to: receive a first fuel valve position (FVP) from the first position sensor, and apply the first FVP to the first delta curve to obtain a first offset; receive a second FVP from the second position sensor, and apply the second FVP to second delta curve to obtain a second offset; add the first offset to the first FVP to obtain the first compensated FVP; add the second offset to the second FVP to obtain the second compensated FVP; correlate the first compensated FVP and the second compensated FVP to obtain a final compensated FVP; apply the final fuel valve position to a fuel valve to control the operation of the fuel valve.

The terms and expressions used herein have the ordinary technical meaning as is accorded to such terms and expressions by persons skilled in the technical field as set forth above except where different specific meanings have otherwise been set forth herein. The word "or" when used herein shall be interpreted as having a disjunctive construction rather than a conjunctive construction unless otherwise specifically indicated. The terms "coupled," "fixed," "attached to," and the like refer to both direct coupling, fixing, or attaching, as well as indirect coupling, fixing, or attaching through one or more intermediate components or features, unless otherwise specified herein.

The singular forms "a", "an", and "the" include plural references unless the context clearly dictates otherwise.

Approximating language, as used herein throughout the specification and claims, is applied to modify any quantitative representation that could permissibly vary without resulting in a change in the basic function to which it is related. Accordingly, a value modified by a term or terms such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 10 percent margin.

The foregoing and other benefits may become clearer upon making a thorough review and study of the following detailed description.

Referring now to FIG. 1, one example of a system 100 for controlling fuel valve efficiency in an engine (e.g., an aircraft engine) is described. The system includes a first position sensor 102, a second position sensor 104, a fuel valve 106, and a controller 108.

The first position sensor 102 and the second position sensor 104 sense the position (e.g., amount of opening) of the fuel valve 106. The first position sensor 102 has a first resistor 103 and the second position sensor 104 has a second resistor 105. The purpose of the first resistor 103 and the second resistor 105 is to indicate to the controller 108 which delta curve among the predefined delta curves shall be used in order to properly compensate the first position sensor 102 measurement and the second position sensor 104 measurement. The first resistor 103 and the second resistor 105 are installed with the first position sensor 102 and the second position sensor 104 at the factory or manufacturing facility when the first position sensor 102 and the second position sensor 104 are assembled.

The fuel valve 106 controls the fuel flow rate of fuel flowing from a fuel tank 110 into the combustor 112 of the engine. The combustor 112 ignites the fuel (which is received from compressor stages of the engine) and this ignited fuel turns blades in the turbine section of the engine to provide thrust to the aircraft.

The controller 108 is coupled to the first position sensor 102, the second position sensor 104, the first resistor 103, the second resistor 105 and the fuel valve 106. It will be appreciated that as used herein the term "controller" refers broadly to any microcontroller, computer, or processor-based device with processor, memory, and programmable input/output peripherals, which is generally designed to govern the operation of other components and devices. It is further understood to include common accompanying accessory devices, including memory, transceivers for communication with other components and devices, etc. These architectural options are well known and understood in the art and require no further description here. The controller 108 may be configured (for example, by using corresponding programming stored in a memory as will be well understood by those skilled in the art) to carry out one or more of the steps, actions, and/or functions described herein. The controller 108 may include a memory that includes computer instructions that implement any of the functions described herein.

In one example of the operation of the system of FIG. 1, a first resistance of the first resistor 103 associated with a first position sensor 102 is measured through the controller 108. Based upon the measured first resistance, a first delta curve is selected. The first delta curve describes differences between nominal fuel valve positions and measured fuel valve positions associated with the first position sensor 102.

A second resistance of the second resistor 105 associated with the second position sensor 104 is also measured through the controller 108. Based upon the measured second resistance, a second delta curve is selected. The second delta curve describes differences between the nominal fuel valve positions and measured fuel valve positions associated with the second position sensor 104. The delta curves can also be referred to as "delta position curves."

The controller 108 is configured to receive a first fuel valve position (FVP) from the first position sensor and apply the first FVP to the first delta curve to obtain a first offset. The first offset is applied to the first FVP to obtain the first compensated FVP. The first compensated FVP curve defines flow rates versus valve position such that a known or measured valve position yields a fuel flow rate or value.

The controller 108 is configured to receive a second FVP from the second position sensor and apply the second FVP to second delta curve to obtain a second offset. The second offset is applied to the second FVP to obtain the second compensated FVP. The second compensated FVP curve defines flow rates versus valve position such that a known or measured valve position yields a fuel flow rate or value.

The controller 108 (which may be a full authority digital engine control (FADEC) controller, for example) is configured to correlate the first compensated FVP and the second compensated FVP to obtain a final compensated FVP. For example, the first compensated FVP and the second compensated FVP may be averaged.

The controller 108 is configured to apply the final compensated FVP offset to a desired fuel valve position to obtain a final fuel valve position and apply the final fuel valve position to a fuel valve to control the operation of the fuel valve. The desired fuel valve position may be determined, for example, by a pilot, who indicates the amount of thrust the engine needs, which corresponds to the desired fuel valve position.

In one example of the operation of FIG. 1, a set of predefined curves is determined, for example, by a sensor manufacturer. For each of these curves, FMV opening is shown on the x-axis and FMV flow on the y-axis.

The manufacturer inserts the first position sensor 102 and the second position sensor 104 and then performs a test, mapping measured valve position to measured fuel flow with the first resistor 103 to form a first graph and mapping measured valve position to measured fuel flow with the second resistor 105 to form a second graph.

After this process is complete, the fuel curves are derived by the manufacturer. In this example, two curves are used, the first graph for a 300-ohm resistor and the second graph for a 500-ohm resistor. This can be thought of as two channels (channels A and B each with its own resistance sensor). A nominal (ideal) curve has also been determined by the manufacturer.

To determine the delta curves, for each point on the first graph and the second graph, a delta value with respect to nominal (ideal) curve is determined. A delta value for a particular valve position (shown on the x-axis) is the difference between the given valve position (for a particular fuel flow) on the first graph (or the second graph) as compared to the valve position shown on the nominal curve (for the same fuel flow). In aspects, the first graph and the second graph are close to the nominal curve near the origin. The delta values as between the first graph and the nominal curve are mapped to a first delta curve and the delta values between the second graph and the nominal curve are mapped to a second delta curve. The first and second delta curves may be implemented as look-up tables. The delta curves have fuel valve position on the x-axis versus delta valve position on the y-axis (not fuel flows or delta fuel flow on the y-axis).

Subsequently, the resistance is measured of the first resistor 103. In this example, the measured resistance is 300 ohms so this selects (e.g., the controller 108 selects) the first delta curve associated with the 300-ohm resistor.

A valve position X is measured using the first position sensor 102, and the measured valve position X is applied to the first delta curve to obtain a delta value for the 300-ohm channel. The delta value forms the first compensation.

The resistance of the resistor 105 is measured. In this example, the measured resistance is 500 ohms so this selects (e.g., the controller 108 selects) the second graph for the 500-ohm resistor.

A valve position Y is measured using the second position sensor 104, and the measured valve position Y is applied by the controller 108 to the second delta curve to obtain a delta value for the 500-ohm channel. The delta value forms the second compensation.

The first compensation and second compensation are applied to the first measured valve position X and to the second measured valve position Y, respectively. The first compensated position and the second compensated position may be correlated or analyzed by the controller 108 to select a final compensated position. For example, the average of the first compensated position and the second compensated position may be obtained. In other cases, the first compensated position and the second compensated position are the same.

The controller 108 adjusts a desired valve position according to the final compensated position to obtain the actual desired valve position that is used to control an amount of opening of the fuel valve 106. A desired fuel position, in some examples, may be indicated by a pilot adjusting a lever to select an amount of thrust needed by the engine, and the selected amount of thrust can be converted by the controller 108 to a valve position of the fuel valve 106.

Figure 2:
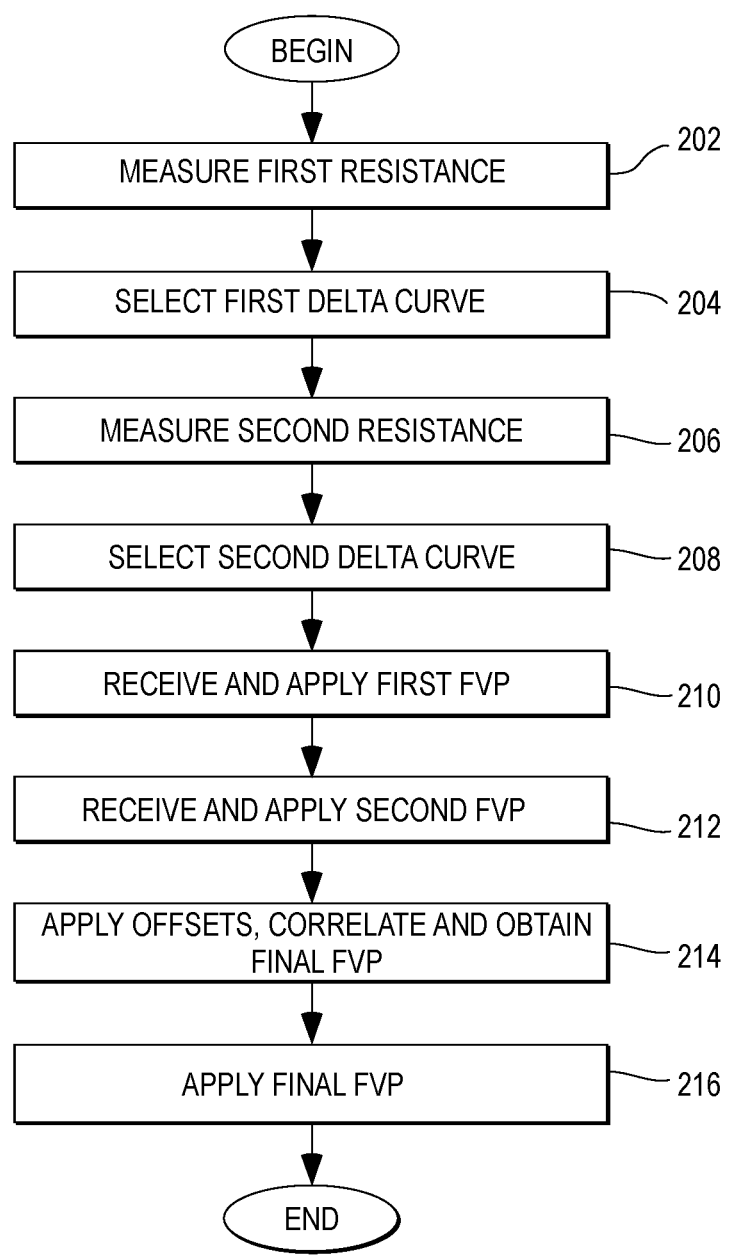
FIG. 2 comprises a flow diagram as configured in accordance with various embodiments of these teachings.

FIG. 2, one example of controlling fuel valve position is described. This process calculates a correction or change to a current fuel valve opening position (e.g., expressed as a percentage number, etc.).

At step 202, a first resistance of a first resistor associated with a first position sensor is measured. For example, the controller 108 measures a first resistance of 300 ohms for the first resistor 103 associated with the first position sensor 102.

At step 204, based upon the measured first resistance, a first delta curve is selected. The first delta curve describes differences between expected nominal valve position and measured valve position for a given fuel flow, associated with the first resistor with the first position sensor. For example, the controller 108 selects the first delta curve that has been stored in a memory associated with the controller 108.

At step 206, a second resistance of a second resistor associated with a second position sensor is measured. For example, the controller 108 measures a second resistance of 500 ohms for the second resistor 105 associated with the second position sensor 104.

At step 208, based upon the measured second resistance, a second delta curve is selected. The second delta curve describes differences between the expected nominal valve position and measured valve position for a given fuel flow, associated with second resistor with the second position sensor. For example, the controller 108 selects the second delta curve that has been stored in the memory associated with the controller 108.

At step 210, a first fuel valve position (FVP) is received from the first position sensor. For example, the controller 108 receives the first FVP from the first position sensor 102. The first FVP is applied to the first delta curve to obtain a first offset. For example, the controller 108 applies the first FVP to the first delta curve to obtain the first offset.

At step 212, a second FVP is received from the second position sensor. For example, the controller 108 receives the second FVP from the second position sensor 104. The second FVP is applied to second delta curve to obtain a second offset. For example, the controller 108 applies the second FVP to the second delta curve to obtain the second offset.

At step 214, the first offset and the second offset are applied to the measured FVPs. For example, the controller 108 applies the first offset and the second offset to the measured FVP's. Compensated FVP's are then correlated or analyzed to obtain a final compensated FVP. For example, the controller 108 correlates and analyzes the FVP's to obtain the final compensated FVP.

At step 216, the final compensated FVP is applied to a desired fuel valve position to obtain a final fuel valve position. The final fuel valve position is applied to a fuel valve to control the operation of the fuel valve. For example, the controller 108 may apply the final fuel valve position to the fuel valve 106. The desired fuel valve position may be indicated directly or indirectly by the pilot operating the aircraft. For example, the pilot may control a lever (indicating an amount of desired thrust, which is translated by the controller 108 to a fuel valve position), push buttons, or otherwise indicate an amount of fuel needed.

Figure 3:
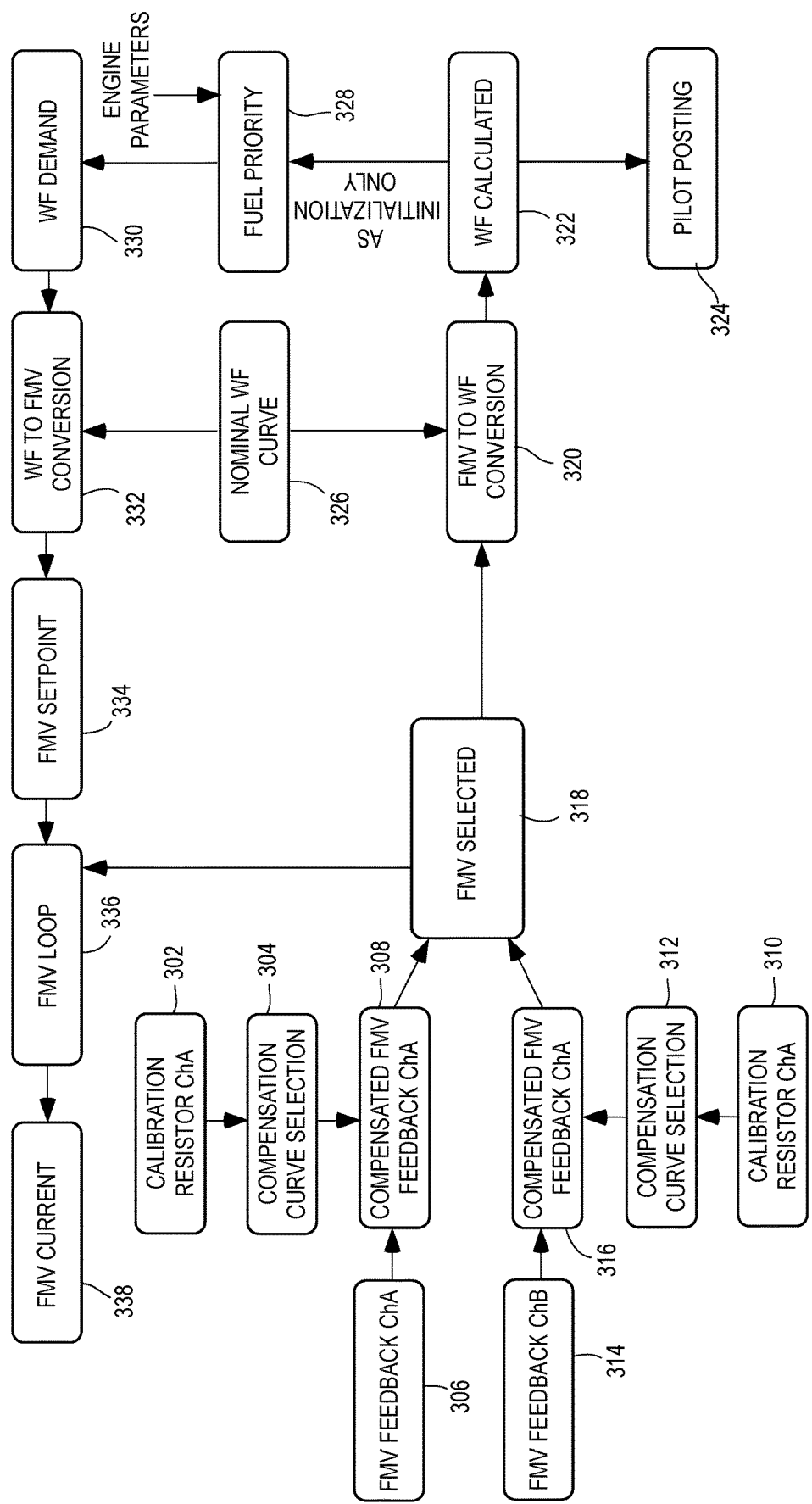
FIG. 3 comprises a flow diagram as configured in accordance with various embodiments of these teachings.

Referring now to FIG. 3, one approach to compensation of fuel valve position is described. The approach assumes the use of a FMV with two channels (resistors) A and B.

At step 302, for channel A, a first calibration resistor is measured (for example, 300 ohms). This first calibration resistor is inserted inside the FMU (Fuel Metering Unit) by the FMU manufacturer after the unit characterization tests. For example, the controller 108 measures a first resistance of 300 ohms for the first resistor 103.

At step 304, for channel A, a first compensation valve position curve is selected that is a match for the first calibration resistor selected. The first compensation curve represents delta values of the difference between a nominal curve and the notional curve associated with the 300-ohm resistor. The first notional curve, in aspects is derived by the manufacturer. In an example, the controller 108 selects the first compensation valve position curve. Alternatively, a human may make the selection.

At step 306, for channel A, a first valve position is measured. For example, the controller 108 measures the first valve position using the first position sensor 102.

At step 308, for channel A, a first delta value associated with the first valve position is determined by applying the first valve position to the first delta curve (along the x-axis) and then finding the corresponding first delta value on the y-axis. This can be implemented using a look-up table or similar arrangement. For example, the controller 108 determines the first delta value.

At step 310, for channel B, a second calibration resistor is measured, for example, 500 ohms. This second calibration resistor is inserted inside the FMU (Fuel Metering Unit) by the FMU manufacturer after the unit characterization tests. For example, the controller 108 measures the second resistance of the second resistor 105.

At step 312, for channel B, a second compensation valve position curve is selected that is a match for the second calibration resistor that has been selected. The second compensation curve represents delta values of the difference between a nominal curve and the second notional curves associated with the 500-ohm resistor. The second notional curve, in aspects is derived by the manufacturer. For example, the controller 108 may make the selection. Alternatively, a human may make the selection.

At step 314, for channel B, a second valve position is measured. For example, the controller 108 measures the second valve position using the second position sensor 104.

At step 316, for channel B, a second delta value associated with the second valve position is determined by applying the second valve position to the second delta curve (along the x-axis) and then finding the corresponding second delta value on the y-axis. This can be implemented using a look-up table or similar arrangement. For example, the controller 108 may determine the second delta value.

At step 318, the first delta value and the second delta value are used to determine a FMV compensation (or value). In examples, the first FMV compensated value and the second FMV compensated value may be averaged to obtain the final value. For example, the controller 108 may determine the FMV compensation.

At step 320, the FMV compensation (or value) is converted to a fuel valve position Wf. For example, the controller 108 may perform this conversion.

At step 322, the Wf is transmitted to the pilot. For example, the controller 108 may transmit the Wf to the pilot.

At step 324, the calculated Wf is rendered the pilot or some other person, for example, using a user interface.

At step 326, a nominal curve for Wf is determined. This may be a predetermined curve supplied by a manufacturer.

At step 328, a fuel priority is determined. The fuel priority is determined from engine parameters such as speed, torque, thrust, or pressure. The fuel priority represents the Wf demand needed to maintain the parameters. Various approaches can be used to implement this functionality such as applying the engine parameters to a lookup table or other data structure.

At step 330, the Wf demand is transmitted to step 332. For example, this operation may be performed by the controller 108.

At step 332, the Wf demand is converted to FMV position, for example using a lookup table. For example, the controller 108 may perform this conversion.

At step 334, the FMV position (or set point) is transmitted to the next step. For example, the controller 108 may perform this conversion.

At step 336, FMV position for the Wf demand is adjusted by the FMV compensation (or value) determined at step 318 and this form at step 338 an FMV position that is applied to control the amount of opening in the FMV (e.g., the fuel valve 106).

Figure 4:
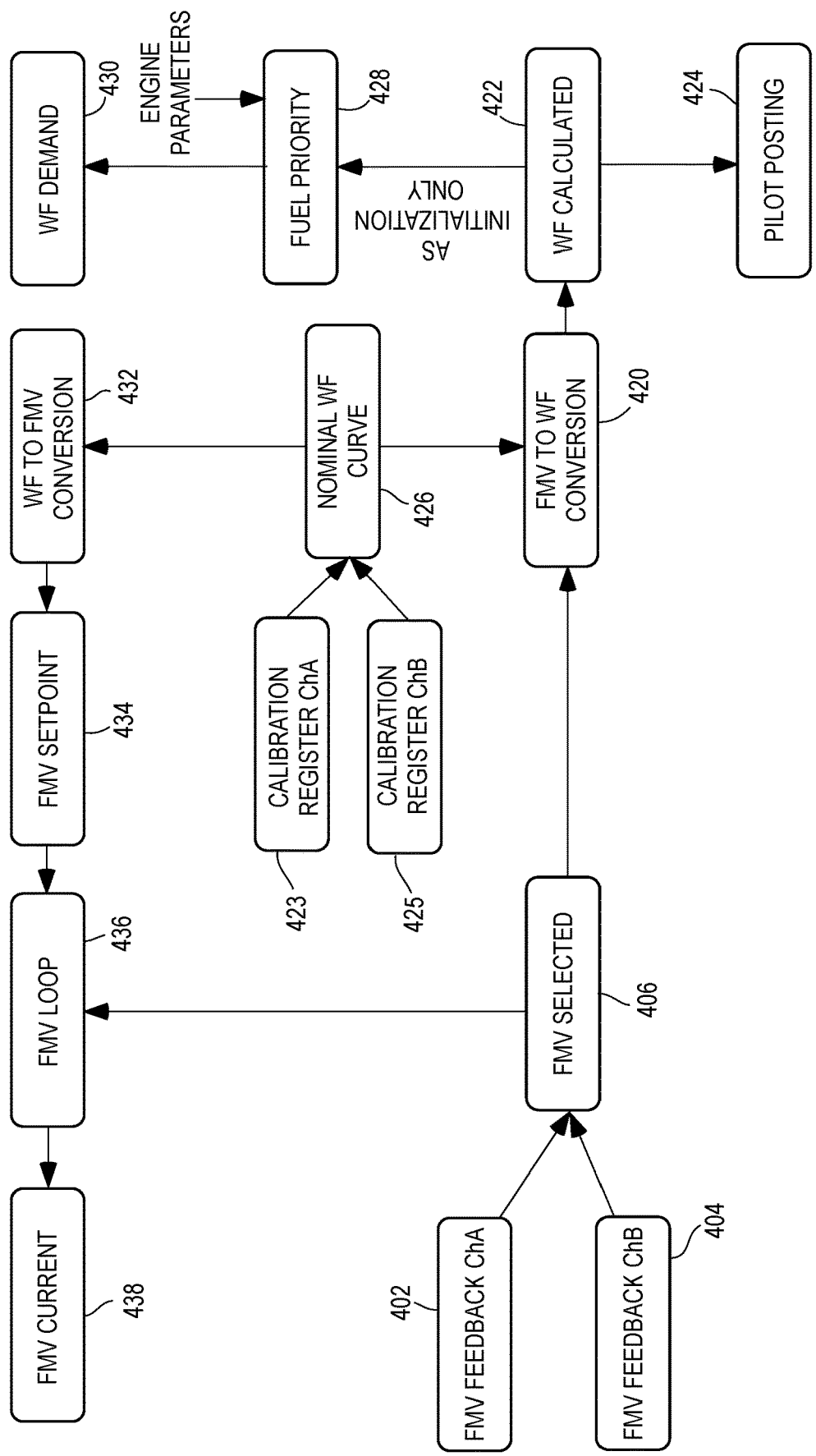
FIG. 4 comprises a flow diagram as configured in accordance with various embodiments of these teachings.

Referring now to FIG. 4, an alternative approach to compensation of fuel valve position is described. The approach assumes the use of a FMV with two channels (resistors) A and B. In this example, a first calibration resistor, for example, 300 ohms. and a second calibration resistor, for example, 500 ohms are selected.

At step 402, for channel A, a first valve position is measured. For example, the controller 108 measures the first valve position of the fuel valve 106 using the first position sensor 102.

At step 404, for channel B, a second valve position is measured. For example, the controller 108 measures the second valve position of the fuel valve 106 using the second position sensor 104.

At step 406, the first valve position and the second value position are used to determine a FMV value. In aspects, the first valve position and the second value position are averaged. For example, the controller 108 performs the averaging operation.

At step 420, the FMV value is converted to a fuel flow Wf. For example, the controller 108 performs the conversion operation.

At step 422, the Wf value is transmitted to the pilot. For example, the controller 108 transmits the Wf value to the pilot over a communication channel (e.g., a wire or a wireless communication link).

At step 424, the calculated Wf is rendered the pilot or some other person, for example, using a user interface.

At step 423, a first Wf (not delta) curve is selected based upon measured resistance. For example, the controller 108 (e.g., FADEC controller) might choose a first Wf curve if the resistance is 300 ohms. Alternatively, a human may make the selection.

At step 425, a second Wf (not delta) curve is selected based upon measured resistance. For example, the controller 108 (e.g., FADEC controller) might choose a second Wf curve if the resistance is 500 ohms. Alternatively, a human may make the selection.

At step 426, the final curve is selected and this may be the average of the first Wf curve and the second Wf curve. For example, the controller 108 may perform the selection.

At step 428, a fuel priority is determined. The fuel priority is determined from engine parameters such as speed, torque, thrust, or pressure. The fuel priority represents the Wf demand needed to maintain the parameters. Various approaches can be used to implement this functionality such as applying the engine parameters to a lookup table or other data structure. For example, the controller 108 may apply the engine parameters to a lookup table stored in an electronic memory.

At step 430, the Wf demand is transmitted to step 432. This operation may be performed by the controller 108.

At step 432, the Wf demand is converted to FMV position, for example using a lookup table. For example, the controller 108 may perform the conversion.

At step 434, the FMV position (or set point) is transmitted to the next step. In examples, the controller 108 may perform the transmission.

At step 436, FMV position for the Wf demand is adjusted by the FMV value determined at step 406 and this form at step 438 an FMV position that is applied to control the amount of opening in the FMV.

Figure 5:
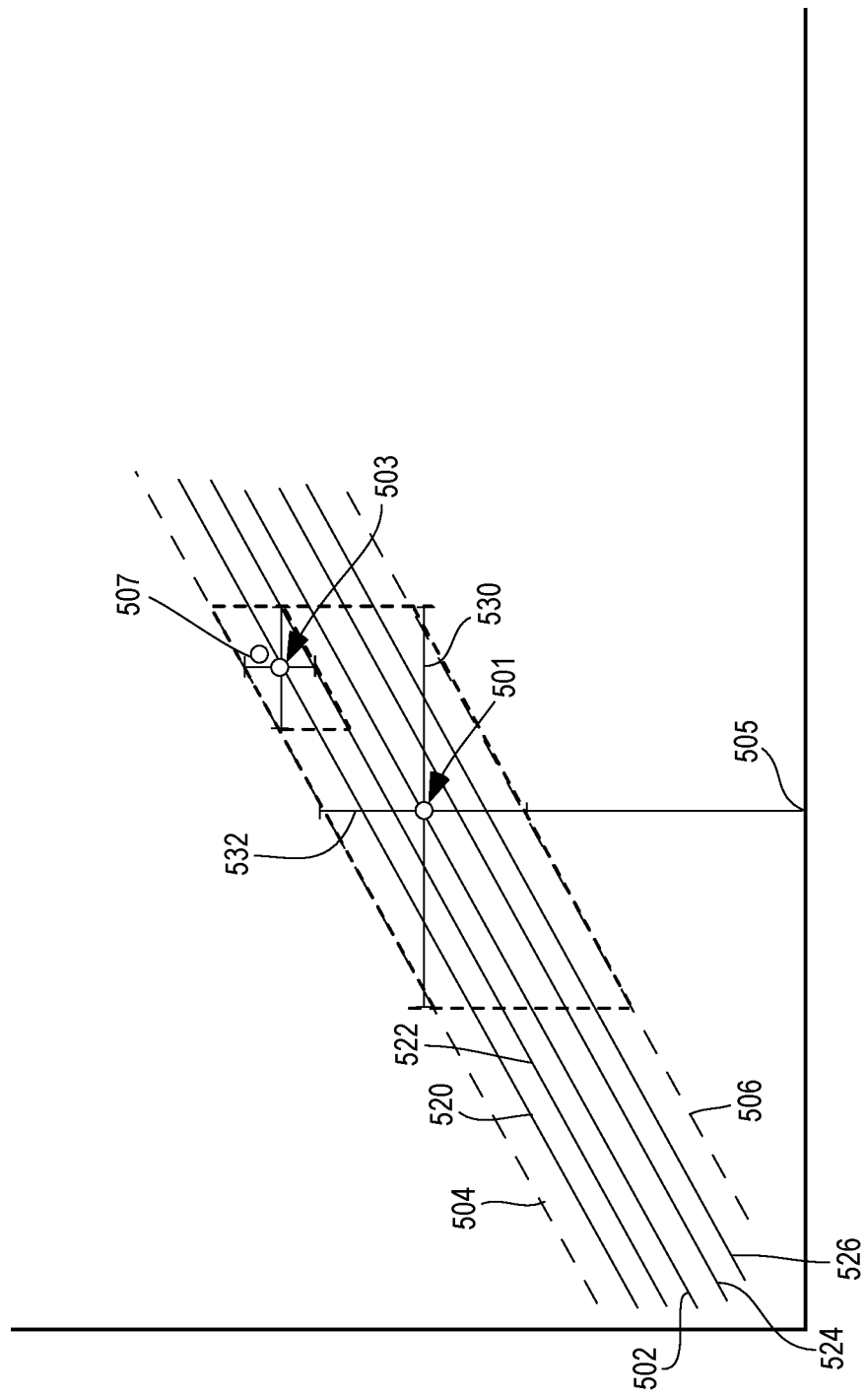
FIG. 5 comprises a diagram as configured in accordance with various embodiments of these teachings.

Referring now to FIG. 5, a diagram showing advantages of the approaches provided herein are described. The graph shows fuel valve positions on the x-axis and fuel flow on the y-axis.

This shows nominal curve 502 with a calculated a fuel flow Wf 505. Boundary curves 504 and 506 define errors in the x-direction 530 and errors in the y-direction 532. Point 501 is calculated using current approaches without use of resistance curves. Point 503 is calculated but on resistance curve. Real position is indicated at point 507.

Curves 520, 522, 524 and 526 are resistance curves of Wf for a particular resistor and are supplied by the manufacturer.

It can be seen that the point 503 is much closer to the point 507 than is the point 501. The present approaches allow the system to partially compensate for orifice tolerances and LVDT errors, shrinking Wf error envelope and thus increasing Wf accuracy up to approximately five times.

Figure 6:
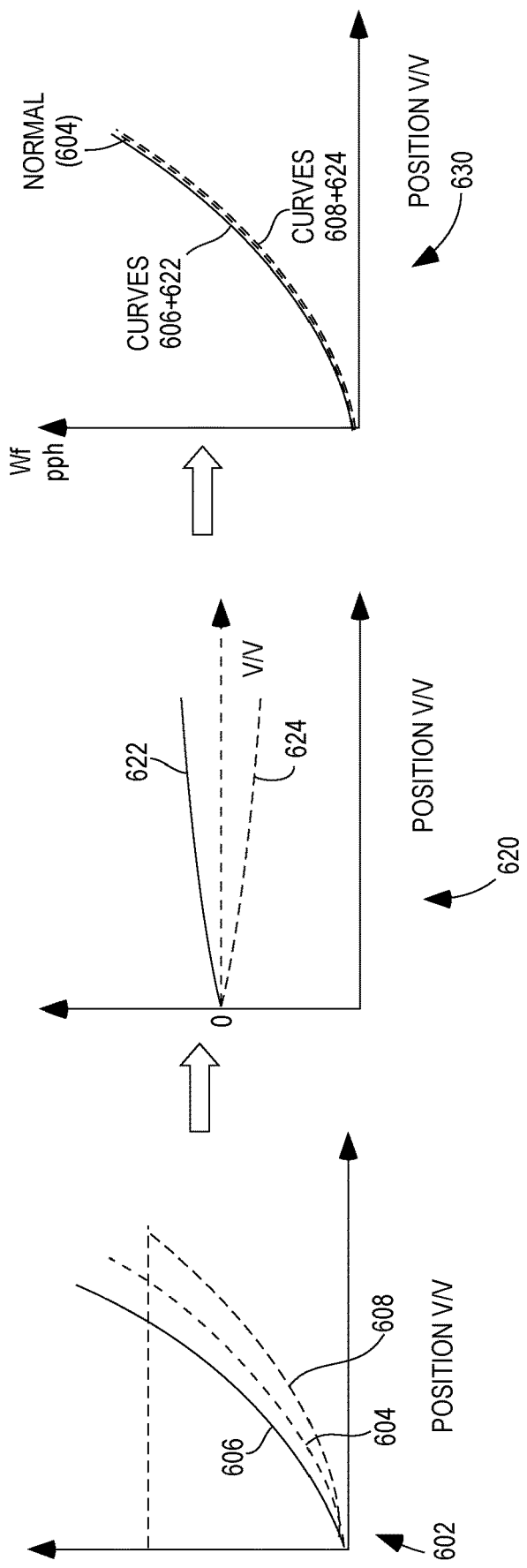
FIG. 6 comprises a diagram as configured in accordance with various embodiments of these teachings.

Referring now to FIG. 6, an approach for deriving a delta curve is described. This figured shows starting from the Fuel Flow (measured in pounds-per-hour (pph)) versus position (e.g., amount or percentage of opening).

A first chart 602 shows a nominal curve 604 and a first Wf curve 605 (relating to a 500-ohm resistor) and a second Wf curve 608 (relating to a 300-ohm resistor).

The first chart 602 is translated to a second chart 620. The second chart 620 maps delta values between the first Wf curve 606 and the nominal curve 604 to a first delta curve 622. The second chart 620 also maps delta values between the second Wf curve 608 and the nominal curve 604 to a second delta curve 624.

In other words, starting from Wf curves, an equivalent set of DeltaVV curves is derived, where DeltaVV is the offset to be added to VV measurement, in order to align this measurement to the nominal Wf curve, for all fuel flows: DeltaVV_i=VV_Nominal (Wf_Nominal)−VV_Curve_i (Wf_Nominal).

As shown in a third graph 630, adding the delta curves to the Wf curves (606, 608) to the delta curves tend to collapse to the nominal Wf curve.

Advantageously, the present approaches provide a low-cost solution to measuring valve opening (e.g., by using calibration resistors) and increased fuel flow calculation accuracy. The approaches provided herein are easy to use and deploy and increase the operating efficiency of aircraft.

It should be understood that the controllers (e.g., the controller 108) provided herein may implement the various functionality described herein. In terms of hardware architecture, such a controller can include but is not limited to a processor, a memory, and one or more input and/or output (I/O) device interface(s) that are communicatively coupled via a local interface. The local interface can include, for example but not limited to, one or more buses and/or other wired or wireless connections. The processor may be a hardware device for executing software, particularly software stored in a memory. The processor can be a custom made or commercially available processor, a central processing unit (CPU), an auxiliary processor among several processors associated with the computing device, a semiconductor-based microprocessor (in the form of a microchip or chip set) or generally any device for executing software instructions.

The memory devices described herein can include any one or combination of volatile memory elements (e.g., random access memory (RAM), such as dynamic RAM (DRAM), static RAM (SRAM), synchronous dynamic RAM (SDRAM), video RAM (VRAM), and so forth) and/or nonvolatile memory elements (e.g., read only memory (ROM), hard drive, tape, CD-ROM, and so forth). Moreover, the memory may incorporate electronic, magnetic, optical, and/or other types of storage media. The memory can also have a distributed architecture, where various components are situated remotely from one another, but can be accessed by the processor.

The controllers may implement the functions described herein in any combination of hardware and software (e.g., with the software being executed by a controller). The software may be stored in any memory device and may include one or more separate programs, each of which includes an ordered listing of executable instructions for implementing the functions described herein. When constructed as a source program, the program is translated via a compiler, assembler, interpreter, or the like, which may or may not be included within the memory.

It will be appreciated that any of the approaches described herein can be implemented at least in part as computer instructions stored on a computer media (e.g., a computer memory as described above) and these instructions can be executed on a controller such as a microprocessor. However, as mentioned, these approaches can be implemented as any combination of electronic hardware and/or software.

Further aspects of the disclosure are provided by the subject matter of the following clauses:

A method, the method comprising measuring a first resistance of a first resistor associated with a first position sensor; based upon the measured first resistance, selecting a first delta curve, the first delta curve describing differences between a nominal fuel valve position and a first measured fuel valve position associated with the first position sensor; measuring a second resistance of a second resistor associated with a second position sensor; based upon the measured second resistance, selecting a second delta curve, the second delta curve describing differences between the nominal fuel valve position and a second measured fuel valve position associated with the second position sensor; receiving a first fuel valve position (FVP) from the first position sensor, and applying the first FVP to the first delta curve to obtain a first compensated FVP; receiving a second FVP from the second position sensor, and applying the second FVP to second delta curve to obtain a second compensated FVP; correlating the first compensated FVP and the second compensated FVP to obtain a final compensated FVP; applying the final compensated FVP to a desired fuel valve position to obtain a final fuel valve position and applying the final fuel valve position to the fuel valve to control the operation of the fuel valve.

The method of any preceding clause, wherein the first delta curve and second delta curve are represented as a table.

The method of any preceding clause, wherein the desired fuel value position is obtained via an apparatus in a cockpit of an aircraft.

The method of any preceding clause, wherein the fuel valve controls an amount of fuel provided to an engine of an aircraft.

The method of any preceding clause, wherein the first delta curve and the second delta curve are derived from curves obtained by an engine manufacturer.

The method of any preceding clause, wherein the first FVP and the second FVP indicate an amount of an opening of the fuel valve.

The method of any preceding clause, wherein the steps are performed in a continuous loop.

The method of any preceding clause, wherein the first compensated FVP and the second compensated FVP are similar in value.

The method of any preceding clause, wherein correlating the first compensated FVP and the second compensated FVP averages the first compensated FVP and the second compensated FVP.

A system, comprising: a first position sensor; a second position sensor; a fuel valve; a controller coupled to the first position sensor, the second position sensor, and the fuel valve; wherein a first resistance of a first resistor associated with a first position sensor is measured and based upon the measured first resistance, a first delta curve is selected, the first delta curve describing differences between a nominal fuel valve position and a first measured fuel valve position associated with the first position sensor; wherein a second resistance of a second resistor associated with a second position sensor is measured and based upon the measured second resistance, a second delta curve is selected, the second delta curve describing differences between the nominal fuel valve position and a second measured fuel valve position associated with the second position sensor; wherein the controller is configured to: wherein the controller is configured to: receive a first fuel valve position (FVP) from the first position sensor, and apply the first FVP to the first delta curve to obtain a first compensated FVP; receive a second FVP from the second position sensor, and apply the second FVP to the second delta curve to obtain a second compensated FVP; correlate the first compensated FVP and the second compensated FVP to obtain a final compensated FVP; and apply the final compensated FVP to a desired fuel valve position to obtain a final fuel valve position and apply the final fuel valve position to the fuel valve to control an operation of the fuel valve.

The system of any preceding clause, wherein the first delta curve and second delta curve are represented as a table.

The system of any preceding clause, wherein the desired fuel value position is obtained via an apparatus in a cockpit of an aircraft.

The system of any preceding clause, wherein the fuel valve controls an amount of fuel provided to an engine of an aircraft.

The system of any preceding clause, wherein the first delta curve and the second delta curve are derived from curves obtained by an engine manufacturer.

The system of any preceding clause, wherein the first FVP and the second FVP indicate an amount of an opening of the fuel valve.

The system of any preceding clause, wherein the steps are performed in a continuous loop.

The system of any preceding clause, wherein the first compensated FVP and the second compensated FVP are similar in value.

The system of any preceding clause, wherein correlating the first compensated FVP and the second compensated FVP averages the first compensated FVP and the second compensated FVP.

A non-transitory, machine-accessible storage medium having computer instructions and wherein the instructions are configured, when executed by a controller to cause the machine to: measure a first resistance of a first resistor associated with a first position sensor; based upon the measured first resistance, select a first delta curve, the first delta curve describing differences between a nominal fuel valve position and a first measured fuel valve position associated with the first position sensor; measure a second resistance of a second resistor associated with a second position sensor; based upon the measured second resistance, select a second delta curve, the second delta curve describing differences between the nominal fuel valve position and a second measured fuel valve position associated with the second position sensor; receive a first fuel valve position (FVP) from the first position sensor, and applying the first FVP to the first delta curve to obtain a first compensated FVP; receive a second FVP from the second position sensor, and apply the second FVP to second delta curve to obtain a second compensated FVP; correlating the first compensated FVP and the second compensated FVP to obtain a final compensated FVP; apply the final compensated FVP to a desired fuel valve position to obtain a final fuel valve position and apply the final fuel valve position to the fuel valve to control the operation of the fuel valve.

The non-transitory, machine-accessible storage medium of any preceding clause, wherein the first delta curve and second delta curve are represented as a table.

The non-transitory, machine-accessible storage medium of any preceding clause, wherein the desired fuel value position is obtained via an apparatus in a cockpit of an aircraft.

The non-transitory, machine-accessible storage medium of any preceding clause, wherein the fuel valve controls an amount of fuel provided to an engine of an aircraft.

The non-transitory, machine-accessible storage medium of any preceding clause, wherein the first delta curve and the second delta curve are derived from curves obtained by an engine manufacturer.

The non-transitory, machine-accessible storage medium of any preceding clause, wherein the first FVP and the second FVP indicate an amount of an opening of the fuel valve.

The non-transitory, machine-accessible storage medium of any preceding clause, wherein the steps are performed in a continuous loop.

The non-transitory, machine-accessible storage medium of any preceding clause, wherein the first compensated FVP and the second compensated FVP are similar in value.

The non-transitory, machine-accessible storage medium of any preceding clause, wherein correlating the first compensated FVP and the second compensated FVP averages the first compensated FVP and the second compensated FVP.

Those skilled in the art will recognize that a wide variety of modifications, alterations, and combinations can be made with respect to the above-described embodiments without departing from the scope of the disclosure, and that such modifications, alterations, and combinations are to be viewed as being within the ambit of the inventive concept.

What is claimed is:

1. A non-transitory, machine-accessible storage medium having computer instructions and wherein the instructions are configured, when executed by a controller, to cause the controller to:
   measure a first resistance of a first resistor associated with a first position sensor;
   based upon the measured first resistance, select a first delta curve, the first delta curve describing differences between a nominal fuel valve position and a first measured fuel valve position associated with the first position sensor;
   measure a second resistance of a second resistor associated with a second position sensor;
   based upon the measured second resistance, select a second delta curve, the second delta curve describing differences between the nominal fuel valve position and a second measured fuel valve position associated with the second position sensor;
   receive a first fuel valve position (FVP) from the first position sensor, and apply the first FVP to the first delta curve to obtain a first compensated FVP;
   receive a second FVP from the second position sensor, and apply the second FVP to the second delta curve to obtain a second compensated FVP;
   correlate the first compensated FVP and the second compensated FVP to obtain a final compensated FVP;
   apply the final compensated FVP to a desired fuel valve position to obtain a final fuel valve position and apply the final fuel valve position to a fuel valve to control an operation of the fuel valve.

2. The non-transitory, machine-accessible storage medium of claim 1, wherein the first delta curve and the second delta curve are represented as a table.

3. The non-transitory, machine-accessible storage medium of claim 1, wherein the desired fuel valve position is obtained via an apparatus in a cockpit of an aircraft.

4. The non-transitory, machine-accessible storage medium of claim 1, wherein the fuel valve controls an amount of fuel provided to an engine of an aircraft.

5. The non-transitory, machine-accessible storage medium of claim 1, wherein the first delta curve and the second delta curve are derived from curves obtained by a manufacturer.

6. The non-transitory, machine-accessible storage medium of claim 1, wherein the first FVP and the second FVP indicate an amount of an opening of the fuel valve.

7. The non-transitory, machine-accessible storage medium of claim 1, wherein at least some of the steps are performed in a continuous loop.

8. The non-transitory, machine-accessible storage medium of claim 1, wherein the first compensated FVP and the second compensated FVP are similar in value.

9. The non-transitory, machine-accessible storage medium of claim 1, wherein correlating the first compensated FVP and the second compensated FVP averages the first compensated FVP and the second compensated FVP.

10. A system, the system comprising:
   a first position sensor;
   a second position sensor;
   a fuel valve;
   a controller coupled to the first position sensor, the second position sensor, and the fuel valve;
   wherein a first resistance of a first resistor associated with the first position sensor is measured and based upon the measured first resistance, a first delta curve is selected, the first delta curve describing differences between a nominal fuel valve position and a first measured fuel valve position associated with the first position sensor;
   wherein a second resistance of a second resistor associated with the second position sensor is measured and based upon the measured second resistance, a second delta curve is selected, the second delta curve describing differences between the nominal fuel valve position and a second measured fuel valve position associated with the second position sensor;
   wherein the controller is configured to:
      receive a first fuel valve position (FVP) from the first position sensor, and apply the first FVP to the first delta curve to obtain a first compensated FVP;
      receive a second FVP from the second position sensor, and apply the second FVP to the second delta curve to obtain a second compensated FVP;
      correlate the first compensated FVP and the second compensated FVP to obtain a final compensated FVP;
      apply the final compensated FVP to a desired fuel valve position to obtain a final fuel valve position and apply the final fuel valve position to the fuel valve to control an operation of the fuel valve.

11. The system of claim 10, wherein the first delta curve and second delta curve are represented as a table.

12. The system of claim 10, wherein the desired fuel valve position is obtained via an apparatus in a cockpit of an aircraft.

13. The system of claim 10, wherein the fuel valve controls an amount of fuel provided to an engine of an aircraft.

14. The system of claim 10, wherein the first delta curve and the second delta curve are derived from curves obtained by a manufacturer.

15. The system of claim 10, wherein the first FVP and the second FVP indicate an amount of an opening of the fuel valve.

16. The system of claim 10, wherein at least some of the steps executed by the controller are performed in a continuous loop.

17. The system of claim 10, wherein the first compensated FVP and the second compensated FVP are similar in value.

18. The system of claim 10, wherein correlating the first compensated FVP and the second compensated FVP averages the first compensated FVP and the second compensated FVP.

19. A method, comprising:
   measuring a first resistance of a first resistor associated with a first position sensor;
   based upon the measured first resistance, selecting a first delta curve, the first delta curve describing differences between a nominal fuel valve position and a first measured fuel valve position associated with the first position sensor;
   measuring a second resistance of a second resistor associated with a second position sensor;
   based upon the measured second resistance, selecting a second delta curve, the second delta curve describing differences between the nominal fuel valve position and a second measured fuel valve position associated with the second position sensor;
   receiving a first fuel valve position (FVP) from the first position sensor, and applying the first FVP to the first delta curve to obtain a first compensated FVP;
   receiving a second FVP from the second position sensor, and applying the second FVP to the second delta curve to obtain a second compensated FVP;

correlating the first compensated FVP and the second compensated FVP to obtain a final compensated FVP;

applying the final compensated FVP to a desired fuel valve position to obtain a final fuel valve position and applying the final fuel valve position to a fuel valve to control an operation of the fuel valve.

20. The method of claim 19, wherein the first delta curve and the second delta curve are represented as a table.

\* \* \* \* \*

UNITED STATES PATENT AND TRADEMARK OFFICE
CERTIFICATE OF CORRECTION

PATENT NO. : 11,920,522 B2
APPLICATION NO. : 17/882268
DATED : March 5, 2024
INVENTOR(S) : di Leo et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 22 days.

Signed and Sealed this
Twelfth Day of August, 2025

Coke Morgan Stewart
*Acting Director of the United States Patent and Trademark Office*